United States Patent [19]
Lin et al.

[11] Patent Number: 5,102,777
[45] Date of Patent: Apr. 7, 1992

[54] RESIST STRIPPING

[75] Inventors: Wei-Yuan Lin, Campbell; Noor U. Haq, Saratoga; Dalton Chen, Santa Clara, all of Calif.

[73] Assignee: Ardrox Inc., La Mirada, Calif.

[21] Appl. No.: 473,587

[22] Filed: Feb. 1, 1990

[51] Int. Cl.$^5$ .................................. G03C 5/00
[52] U.S. Cl. ...................... 430/331; 430/326; 430/327; 430/329; 134/2; 134/3; 134/38; 134/41; 134/42; 252/162
[58] Field of Search ............... 430/326, 327, 329, 331; 134/2, 3, 38, 41, 42; 252/108, 143, 544, 548, 158, 162, 164, 170, 165, 171

[56] References Cited

U.S. PATENT DOCUMENTS

| | | |
|---|---|---|
| 4,130,425 | 12/1978 | Boyd .................................. 430/331 |
| 4,744,834 | 5/1988 | Haq .................................... 430/329 |
| 4,791,043 | 12/1988 | Thomas et al. ..................... 430/329 |
| 4,824,763 | 4/1989 | Lee ..................................... 430/331 |
| 4,851,324 | 7/1989 | Hsieh .................................. 430/331 |

FOREIGN PATENT DOCUMENTS

| | | | |
|---|---|---|---|
| 1057105 | 6/1979 | Canada ............................... 430/329 |
| 208043 | 8/1988 | Japan .................................. 430/329 |

*Primary Examiner*—Hoa Van Le
*Attorney, Agent, or Firm*—Harris, Kern, Wallen & Tinsley

[57] ABSTRACT

A positive photoresist stripper composition includes a solvent system having solubility parameters which fall within a range from about 8.5 to about 15 in an amount which falls within a range from about 65% to about 98%. An amine is present in an amount which falls within a range from about 2% to about 25%. A fatty acid having 8 to 20 carbon atoms is present in an amount which falls within a range from about 0.1% to about 10% (all percents being by weight). The amount of the amine and of the fatty acid are selected to provide a pH which falls in a range from about 6 to about 9.5. Positive photoresist is stripped from a substrate by immersing the substrate in the aforementioned composition. Metal deposited on the substrate is not attached by the composition.

32 Claims, No Drawings

RESIST STRIPPING

TECHNICAL FIELD

The present invention relates to a composition of matter useful for stripping a photoresist material from a substrate and to a method of removing a photoresist material utilizing such composition. The substrate is generally in the nature of a semi-conductor device.

BACKGROUND OF THE INVENTION

Integrated circuit manufacturing technology utilizes positive photoresist type materials for photolithographically delineating patterns on substrates which later on in the process are etched by wet or dry etching techniques and are either left permanently or removed. The positive photoresist materials are spun on or are applied with different methods onto substrates. Then, the substrates are exposed using various types of radiation such as visible and/or ultraviolet light or an electron beam. Different types of exposure machines can be used to accomplish this exposure. After exposure, the substrates go through a wet or dry development process where, due to selective dissolution of certain areas, an image pattern is generated.

The remaining resist material is further exposed to dry or wet etching. This process is essential to define the pattern and to leave behind dielectric or metallic film to be utilized later on in the process sequence. Prior to this etching process the photoresist material may be treated with a blanket of deep ultraviolet radiation at a relatively high temperature. This treatment improves the resist selectivity and provides better etching and dimensional controls.

Prior to photolithographic processing, substrates are coated with different types of dielectrics and with metal films. These coated materials are of different combinations and types. The metal films are often made of very sensitive, i.e., easily chemically attacked, alloys. The nature of the thin film alloys depends upon the deposition system used, the composition of the films, deposition temperature, deposition time, and the like. Such sensitive metal films can react with other chemicals with which they come into contact. The nature of the reactions depend primarily upon the chemical formulations of the solutions utilized. One solution which can attack such sensitive metal films is the positive resist stripper which is used in stripping or cleaning of substrates after wet or dry etching of the sensitive metal films has been used to delineate metal lines or other patterns on the substrate. It is necessary in such a full lithographic process that the photoresist material, following pattern delineation, be evenly and completely removed from all exposed and unexposed areas so as to permit further operations. Even the partial remains of a resist coating in an area to be processed is undesirable as the left over residue of the photoresist material can have a detrimental effect on the yield of acceptable integrated circuits.

In the past, resist materials have been removed by one or more of the following: halogenated hydrocarbons, such as methylene chloride, amines and their derivatives, such as dimethylsulfoxide, dimethylformamide, N-methyl-2-pyrrolidinone, glycol ethers, such as ethylene glycol monomethyl ether, ethanol, ketones, such as methylethyl ketone and acetone and materials, such as isopropyl alcohol, sulfuric acid, ammonium persulfate and mixtures of caustic and phenol derivatives, as well as various other materials.

There are several drawbacks with the use of the aforementioned photoresist material removing compositions. One of the major disadvantages with the above-mentioned methods of stripping photoresist is that the materials used attack underlying metal films or lines, or they leave behind traces of photoresist films. The attack on metal films and lines appears as some form of corrosion. The corrosion of the metal may not be visible immediately after resist stripping but can appear after several days to several months, especially when the semiconductor chip fails in the field. The other symptoms of this metal attack phenomena appear in the form that the metal surface can show cosmetic pitting whereby the surface looks peppery. Sometimes the metal surface is attacked near the grain surface and microscopic craters are etched into the metal. In other cases, the metal lines are attacked thereby reducing those lines from 5% to 50% in width. It is very important to maintain the size of these lines for good circuit reliability and for the functionality of the microchips. When these lines are attacked by strippers of different types and are corroded, their size is reduced and such corrosion can cause electrical failure of the semiconductor chips. Therefore, it is very important that strippers be made of chemicals which do not attack or corrode metal films.

The present invention is directed to overcoming one or more of the problems as set forth above.

DISCLOSURE OF INVENTION

In accordance with an embodiment of the present invention a positive photoresist stripper composition is set forth. The composition comprises a solvent system having solubility parameters which fall in a range from about 8.5 to about 15, the solvent system being present in an amount which falls within a range from about 65% to about 98% composition. An amine is present in an amount which falls within a range from about 2% to about 35% of the composition. A fatty acid having 8 to 20 carbon atoms is present in the composition in an amount which falls within a range from about 0.1 to about 10%. The amounts of the amine and of the fatty acid are selected to provide a pH for the stripper composition which falls within a range from about 6 to about 9.5. All of the above percents are weight percents.

In accordance with another embodiment of the present invention a substrate having a surface area portion covered with a positive photoresist is immersed in a stripper composition as described above under conditions sufficient to strip the positive photoresist from the substrate.

Use of the stripper composition and positive photoresist stripping methods of the invention allows the substantially complete removal of positive photoresist without any significant attack taking place on metal layers and/or lines which may be present on the substrate. As a result, the yield of acceptable product, e.g., integrated circuits, is significantly increased.

BEST MODE FOR CARRYING OUT INVENTION

In accordance with the present invention a stripper composition is set forth for stripping a positive photoresist from a substrate, generally from a semiconductor substrate such as silicon. The stripper composition of the invention has the advantage of being able to thoroughly remove positive photoresist without at the same time attacking metal films and/or metal lines which have been deposited upon the substrate.

The positive photoresist stripper composition of the present invention requires the use of an organic solvent system having solubility parameters (as defined in, for example, the 67th Edition of the Handbook of Chemistry and Physics, CRC Press, Inc. 1986-1987 (Boca Raton, Fla.)) which fall within a range from about 8.5 to about 15, preferably from about 10 to about 12.5. The solvent system may consist of any of a number of individual solvents or may consist of mixtures of several different solvents. Useful solvents include, for example, any of various pyrrolidone compounds, for example, compounds having the formula 2-pyrrolidinone, 1-methyl-2-pyrrolidinone, 1-propyl-2-pyrrolidinone, 1-hydroxymethyl-2-pyrrolidinone, 1-hydroxyethyl-2-pyrrolidinone and 1-hydroxypropyl-2-pyrrolidinone. Other useful solvents include diethylene glycol monoalkyl ethers including, for example, those of the general formula

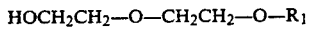

wherein $R_1$ is alkyl of 1 to 4 carbon atoms. Examples of such compounds which are useful in the compositions of the present invention are the monomethyl-, monoethyl- and monobutyl- ethers of diethylene glycol. Other compounds which may be utilized are those containing sulfur oxides such as dimethylsulfoxide or a sulfolane compound represented by the formula

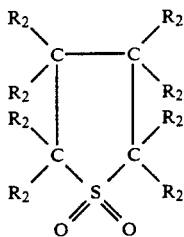

wherein each $R_2$ is hydrogen or alkyl of 1 to 2 carbon atoms or alkoxy of 1 to 2 carbon atoms and wherein at least five of the $R_2$ groups are hydrogen.

In addition to sulfolane, the following alkyl, alkoxy or alkyl/alkoxy substituted derivatives of sulfolane can be used: 3-methylsulfolane, 3,4-diethylsulfolane, 2,5-dimethylsulfolane, 3-methoxysulfolane, 2,4-dimethyl-3-methoxysulfolane, 2,4-dimethyl-4-ethoxysulfolane, 3,4-diethoxysulfolane, 2-methoxy-3-ethylsulfolane, 3,3-dimethylsulfolane, 2,2-diethylsulfolane and the like. Other solvents which may be used include ethylene, propylene, and butylene carbonates.

The solvent system in accordance with the present invention is present in an amount which falls within the range from about 65% to about 98% (volume percent) of the overall stripper composition. More preferably, the solvent system is present in an amount of from about 89% to about 98% of the stripper composition. The particular solvent or solvents chosen to make up the solvent system are not critical to practicing the invention. However, good results have been obtained with a solvent system which includes 47.5 volume percent each of n-methyl pyrrolidone and diethylene glycol monobutyl ether.

A second essential component of the positive photoresist stripper composition of the present invention is an amine. Basically any amine can be utilized which is sufficiently soluble in the solvent system chosen. Useful amines include, for example, those of the general formula

wherein $R_3$, $R_4$ and $R_5$ are the same or different and are hydrogen or alkyl or hydroxyalkyl groups of 1 to 18 carbon atoms, phenyl, alkylphenyl or hydroxyalkylphenyl wherein the alkyl is of 1 to 18 carbon atoms. Specific examples of amines include trimethyl amine, triethyl amine, benzyl dimethyl amine, phenyl dimethyl amine, dodecyl dimethyl amine, hexadecyl dimethyl amine, octadecyl dimethyl amine, dodecyl diethyl amine, hexadecyl diethyl amine, octadecyl diethyl amine, dodecyl di-n-propyl amine, dodecyl di-isopropyl amine, benzyl methyl hexadecyl amine, methyl ethyl hexadecyl amine, p-dodecylbenzyl dimethyl amine, and benzyl methyl octadecyl amine.

Generally, it is preferred to use alkanol amines. Triethanol amine, diethanol amine, dipropyl amine, methanol diethanol amine, propanol diethanol amine and propanol ethanol amine are but examples of a number of useful alkanol amines. The amine which forms a portion of the stripper composition of the present invention should be present in an amount which falls within a range from about 2% to about 35% (by weight) of the stripper composition. More preferably, the amine is present in an amount of from about 2% to about 10% of the stripper composition.

It is essential to the practice of the present invention that a fatty acid form from about 0.1% to about 10% (by weight) of the positive photoresist stripper composition. Preferably the amount of the fatty acid is within the range from about 0.1% to about 1% of the stripper composition. The fatty acid should contain from 8 to 20 carbon atoms, more preferably from about 10 to about 16 carbon atoms. Examples of useful fatty acids include capric acid, lauric acid, talmitic acid, caprilic acid, myristic acid, oleic acid, stearic acid, linoleic acid, linolic acid, buthylic acid, abietic acid, isooctoic acid, isohexadecanoic acid, isostearic acid, behenic acid, undecylinic acid, hydroxystearic acid, clupanodonic acid, arachidonic acid, oleostearic acid, and 2-ethylhexadecahilic acid. A useful stripper composition has been formulated utilizing capric acid in an amount of about ½%.

The amount of the amine and the amount of the fatty acid should be selected, within the range as specified, to provide a pH for the stripper composition which falls within a range from about 6 to about 9.5, more preferably from about 7 to about 8.5. The presence of the fatty acid and the maintenance of the required pH are essential to the stripper composition being effective for stripping positive photoresist without significantly damaging metal films and lines on the substrate from which the resist is being stripped. A composition including 3% triethanol amine, 0.5% capric acid, 60% N-methylpyrrolidone and 36.5% diethylene glycol monobutylether has been found to work very well in stripping a positive photoresist while at the same time not attacking an alloy film where the alloy is AlSiCu.

It is another feature of the stripper composition of the present invention that it is not sensitive to the presence of a considerable amount of water. For example, even if there is as much as 80% water present the metal film will not be significantly attacked. And, even if 5 to 10% of water becomes dissolved in the stripper composition it will still be effective to strip positive photoresist. Thus, the composition can be used in relatively humid environments without any special protection.

The present invention also provides a method of stripping a positive photoresist from a substrate having a surface area covered with the positive photoresist. In accordance with the method the substrate is immersed in the stripper composition as described above under conditions sufficient to strip the positive photoresist from the substrate. Such stripping conditions are not critical and will generally comprise a temperature which falls within a range from about 20° C. to about 160° C., preferably from about 75° C. to about 100° C. with an immersion time which may suitably fall within a range from about 5 minutes to about 30 minutes, suitably about 10 minutes.

The invention will be better understood by reference to the following example which compares utilization of the positive photoresist stripper composition in accordance with the present invention with stripping utilizing conventional positive photoresist stripping compositions of the prior art.

EXAMPLE

The following table illustrates the testing of several stripping compositions in accordance with the present invention. The temperature and time of immersion used in testing the effectiveness of each of the stripper compositions are 90° C. for 10 minutes.

TABLE

| Stripper Composition | % of Positive Photoresist Removal | Amount of Attack on Metal Film |
|---|---|---|
| NMP, 95% TEA, 4.5% capric acid, 0.5% | 100% | None |
| DB, 95% TEA, 4.5% capric acid, 0.5% | 100% | None |
| NMP, 50% DB, 46.5% TEA, 3% capric acid, 0.5% | 100% | None |
| γ-butyrolactone, 46.5% NMP, 50% diglycolamine, 3% lauric acid, 0.5% | 100% | None |
| NMP, 50% DB, 46.5% DEA, 3% lauric acid, 0.5% | 100% | None |
| NMP, 70% DMA, 25% monopropanolamine, 4.5% lauric acid, 0.5% | 100% | None |

NMP = N-methylpyrrolidinone;
DB = diethylene glycol monobutyl ether;
TEA = triethanolamine;
DEA = diethylene glycol diethanolamine; and
DMA = dimethylamino acetamide.

As is demonstrated by the data presented in this Example stripper compositions in accordance with the present invention successfully remove positive photoresist without any attack on metal films or lines on the semiconductor substrate. By contrast, the compositions of the prior art either do not adequately remove the photoresist or significantly attack the metal films, or both.

INDUSTRIAL APPLICABILITY

The present invention provides a positive photoresist stripper composition and a method for stripping positive photoresist useful in the semi-conductor industry. The positive photoresist is successful stripped without any attack on metal layers or lines which are on the substrate. As a result, a significantly higher percentage of usable semi-conductor devices is produced.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

That which is claimed is:

1. A positive photoresist stripper composition comprising:
   a solvent system having solubility parameters which fall within a range from about 8.5 to about 15 in an amount which falls within a range from about 65% to about 98% of said composition;
   an amine in an amount which falls within a range from about 2% to about 35% of said composition; and
   a fatty acid having 8 to 20 carbon atoms in an amount which falls within a range from about 0.1 to about 10%, all of said percents being by weight, the amount of the amine and of the fatty acid being selected to provide a pH for the stripper composition which falls within a range from about 6 to about 9.5.

2. A composition as set forth in claim 1, wherein said solvent is present in an amount which falls within a range from about 89% to about 98%, said amine is present in an amount which falls within a range from about 2% to about 10%, and said fatty acid is present in an amount which falls in a range from about 0.1% to about 1%.

3. A composition as set forth in claim 2, wherein said acid has 10 to 16 carbon atoms.

4. A composition as set forth in claim 3, wherein said acid is selected from the group consisting of capric acid, lauric acid, talmitic acid, caprilic acid, myristic acid, oleic acid, stearic acid, linoleic acid, linolic acid, buthylic acid, abietic acid, isooctoic acid, isohexadecanoic acid, isostearic acid, behenic acid, undecylinic acid, hydroxystearic acid, clupanodonic acid, arachidonic acid, oleostearic acid, and 2-ethylhexadecanilic acid.

5. A composition as set forth in claim 2, wherein said amine comprises an alkanol amine.

6. A composition as set forth in claim 5, wherein said acid has 10 to 16 carbon atoms.

7. A composition as set forth in claim 6, wherein said acid is selected from the group consisting of capric acid, lauric acid, talmitic acid, caprilic acid, myristic acid, oleic acid, stearic acid, linoleic acid, linolic acid, buthylic acid, abietic acid, isooctoic acid, isohexadecanoic acid, isostearic acid, behenic acid, undecylinic acid, hydroxystearic acid, clupanodonic acid, arachidonic acid, oleostearic acid, and 2-ethylhexadecanilic acid.

8. A composition as set forth in claim 2, wherein said solvent comprises a pyrrolidone compound, a diethylene glycol monoalkyl ether, a sulfur oxide compound, a sulfolane compound, or a mixture thereof.

9. A composition as set forth in claim 8, wherein said solvent system comprises about 60% n-methylpyrrolidone and about 36.5% diethylene glycol monobutylether.

10. A composition as set forth in claim 8, wherein said acid has 10 to 16 carbon atoms.

11. A composition as set forth in claim 10, wherein said acid is selected from the group consisting of capric acid, lauric acid, talmitic acid, caprilic acid, myristic acid, oleic acid, stearic acid, linoleic acid, linolic acid, buthylic acid, abietic acid, isooctoic acid, isohexadecanoic acid, isostearic acid, behenic acid, undecylinic acid, hydroxystearic acid, clupanodonic acid, arachidonic acid, oleostearic acid, and 2-ethylhexadecahilic acid.

12. A composition as set forth in claim 8, wherein said amine comprises an alkanol amine.

13. A composition as set forth in claim 12, wherein said acid has 10 to 16 carbon atoms.

14. A composition as set forth in claim 13, wherein said acid is selected from the group consisting of capric acid, lauric acid, talmitic acid, caprilic acid, myristic acid, oleic acid, stearic acid, linoleic acid, linolic acid, buthylic acid, abietic acid, isooctoic acid, isohexadecanoic acid, isostearic acid, behenic acid, undecylinic acid, hydroxystearic acid, clupanodonic acid, arachidonic acid, oleostearic acid, and 2-ethylhexadecahilic acid.

15. A composition as forth in claim 2, wherein said pH falls within a range from about 7 to about 8.5.

16. A composition as set forth in claim 15, wherein said acid has 10 to 16 carbon atoms.

17. A composition as set forth in claim 16, wherein said acid is selected from the group consisting of capric acid, lauric acid, talmitic acid, caprilic acid, myristic acid, oleic acid, stearic acid, linoleic acid, linolic acid, buthylic acid, abietic acid, isooctoic acid, isohexadecanoic acid, isostearic acid, behenic acid, undecylinic acid, hydroxystearic acid, clupanodonic acid, arachidonic acid, oleostearic acid, and 2-ethylhexadecahilic acid.

18. A composition as set forth in claim 17, wherein said amine comprises an alkanol amine.

19. A composition as set forth in claim 18, wherein said solvent comprises a pyrrolidone compound, a diethylene glycol monoalkyl ether, a sulfur oxide compound, a sulfolane compound, or a mixture thereof.

20. A composition as set forth in claim 19, wherein said solvent system comprises about 60% n-methylpyrrolidone and about 36.5% diethylene glycol monobutylether.

21. A method for stripping a positive photoresist from a substrate having a surface area covered with said positive photoresist, comprising:
    immersing the substrate in the stripping composition of claim 1 under conditions sufficient to strip the positive photoresist from the substrate.

22. A method as set forth in claim 21, wherein said conditions comprise a temperature which falls within a range from about 20° C. to about 160° C. for a time which falls within a range from about 5 minutes to about 30 minutes.

23. A method as set forth in claim 22, wherein said substrate has a metal layer and wherein said metal layer is not significantly attacked by said stripper composition.

24. A method as set forth in claim 21, wherein said substrate has a metal layer and wherein said metal layer is not significantly attacked by said stripper composition.

25. A method for stripping a positive photoresist from a substrate having a surface area covered with said positive photoresist, comprising:
    immersing the substrate in the stripping composition of claim 4 under conditions sufficient to strip the positive photoresist from the substrate.

26. A method as set forth in claim 25, wherein said conditions comprise a temperature which falls within a range from about 20° C. to about 160° C. for a time which falls within a range from about 5 minutes to about 30 minutes.

27. A method as set forth in claim 26, wherein said substrate has a metal layer and wherein said metal layer is not significantly attacked by said stripper composition.

28. A method as set forth in claim 25, wherein said substrate has a metal layer and wherein said metal layer is not significantly attacked by said stripper composition.

29. A method for stripping a positive photoresist from a substrate having a surface area covered with said positive photoresist, comprising:
    immersing the substrate in the stripping composition of claim 18 under conditions sufficient to strip the positive photoresist from the substrate.

30. A method as set forth in claim 29, wherein said conditions comprise a temperature which falls within a range from about 20° C. to about 160° C. for a time which falls within a range from about 5 minutes to about 30 minutes.

31. A method as set forth in claim 30, wherein said substrate has a metal layer and wherein said metal layer is not significantly attacked by said stripper composition.

32. A method as set forth in claim 29, wherein said substrate has a metal layer and wherein said metal layer is not significantly attacked by said stripper composition.

* * * * *